United States Patent
Hsu et al.

(10) Patent No.: US 9,835,682 B2
(45) Date of Patent: Dec. 5, 2017

(54) DEBUGGING SYSTEM AND METHOD

(71) Applicant: Nuvoton Technology Corporation, Hsinchu (TW)

(72) Inventors: Yung-Ching Hsu, Hsinchu (TW); Hsin-Chou Lee, Hsinchu (TW)

(73) Assignee: Nuvoton Technology Corporation, Hsinchu (TW)

( * ) Notice: Subject to any disclaimer, the term of this patent is extended or adjusted under 35 U.S.C. 154(b) by 0 days.

(21) Appl. No.: 15/176,134

(22) Filed: Jun. 7, 2016

(65) Prior Publication Data

US 2017/0082688 A1  Mar. 23, 2017

(30) Foreign Application Priority Data

Sep. 22, 2015  (TW) .............................. 104131294 A

(51) Int. Cl.
  *G01R 31/317*  (2006.01)
  *G06F 11/36*  (2006.01)

(52) U.S. Cl.
  CPC ..... *G01R 31/31705* (2013.01); *G01R 31/317* (2013.01); *G06F 11/36* (2013.01)

(58) Field of Classification Search
  CPC .................................................. G01R 31/31
  USPC ........................................ 714/733, 735, 738
  See application file for complete search history.

(56) References Cited

U.S. PATENT DOCUMENTS 5,850,586 A * 12/1998 Sugihara ............ G03G 15/0126
   399/227
2003/0074650 A1* 4/2003 Akgul ................. G06F 11/3624
   717/129

FOREIGN PATENT DOCUMENTS

| CN | 100492315 C | 5/2009 |
| TW | 200636447 A | 10/2006 |
| TW | 200743956 A | 12/2007 |

* cited by examiner

*Primary Examiner* — Fritz Alphonse
(74) *Attorney, Agent, or Firm* — CKC & Partners Co., Ltd.

(57) ABSTRACT

A debugging system includes an embedded device and a terminal computer. The embedded device includes a memory unit, and the memory unit includes a first buffer, the embedded device is configured for executing at least one instruction to generate at least one real-time debugging information, and writing the real-time debugging information into the first buffer. The terminal computer is connected to an in-circuit emulator (ICE) via a first interface, and the ICE is connected to the embedded device via a second interface. The terminal computer uses polling to read the real-time debugging information stored in the first buffer via the ICE, and deletes the real-time debugging information stored in the first buffer afterwards.

10 Claims, 2 Drawing Sheets

DEBUGGING SYSTEM AND METHOD

RELATED APPLICATIONS

This application claims priority to Taiwanese Patent Application Serial Number 104131294, filed Sep. 22, 2015, which is herein incorporated by reference.

BACKGROUND

Field of Disclosure

The present disclosure relates to a debugging system and method. More particularly, the present disclosure relates to a debugging system and method applied in an embedded device.

Description of Related Art

Since embedded devices have characteristics of small size, light-weight, low power consumption and low cost, embedded devices are very popular in the market of consumer electronics products. Because most embedded devices lack components such as keyboard, screen and hard drive, during development of the application program for the embedded device (such as a microcontroller or a chip, etc.), the developers often need to output the debugging information generated during the operations of the program, to a debugging device having the aforementioned components for display, so as to facilitate the debugging work.

There are two common ways for outputting the debugging information, in which one is that the embedded device instantly transmits the debugging information to the debugging device via a universal asynchronous receiver/transmitter. However, because of cost considerations, many embedded devices under development do not have the universal asynchronous receiver/transmitters.

Another way of outputting the debugging information is, through input/output pins of a general embedded device, to use a semihosting mechanism to transmit the debugging information to the debug device. The semihosting mechanism is a software debugging mechanism. The embedded device interrupts the running program via a software manner, and then the debug device receives an interrupt notice and obtains the debugging information from the embedded device. The embedded device terminates the interruption and resumes operation after the debug end obtains the debugging information. Although no universal asynchronous receiver/transmitter is needed in the latter, the operations of the programs will be interrupted while the debug device obtains the debugging information, thereby reducing the debugging efficiency.

SUMMARY

An aspect of the disclosure is to provide a debugging system; the debugging system includes an embedded device and a terminal computer. The embedded device includes a memory unit, and the memory unit includes a first buffer, the embedded device is configured to execute at least one instruction to generate at least one real-time debugging information, and writing the real-time debugging information into the first buffer. The terminal computer is connected to an in-circuit emulator (ICE) via a first interface, and the ICE is connected to the embedded device via a second interface. The terminal computer uses polling to read the real-time debugging information stored in the first buffer via the ICE, and deletes the real-time debugging information stored in the first buffer after reading the real-time debugging information.

An aspect of the disclosure is to provide a debugging method. The debugging method includes: by a terminal computer, using polling to read at least one real-time debugging information from an embedded device via an in-circuit emulator (ICE), wherein the embedded device is configured for executing at least one instruction to generate the real-time debugging information, and writing the real-time debugging information into the first buffer in the embedded device; deleting the real-time debugging information stored in the first buffer after the real-time debugging information is read.

The debugging system and the debugging method of the present disclosure can reduce the development costs of the embedded device. Under the premise of adding no additional hardware interface, in the present disclosure the pins originally within the embedded device are used to transmit the real-time debugging information. In addition, when the embedded device outputs the real-time debugging information, the real-time debugging information is stored in the memory unit, and the terminal computer deletes the real-time debugging information after the terminal computer reads the real-time debugging information, so that new real-time debugging information can be stored in the memory unit. As a result, the operations of the embedded device do not need to be interrupted for transmittal of the real-time debugging information, so that the operation of the program can be continuous during the debugging processes, and the required debugging time can be significantly shortened and the development efficiency is improved. In addition, the embedded device also includes a second buffer, which is configured to store the remote information by the terminal computer, in order to eliminate the need of extra interface, and the development cost is thus further reduced.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
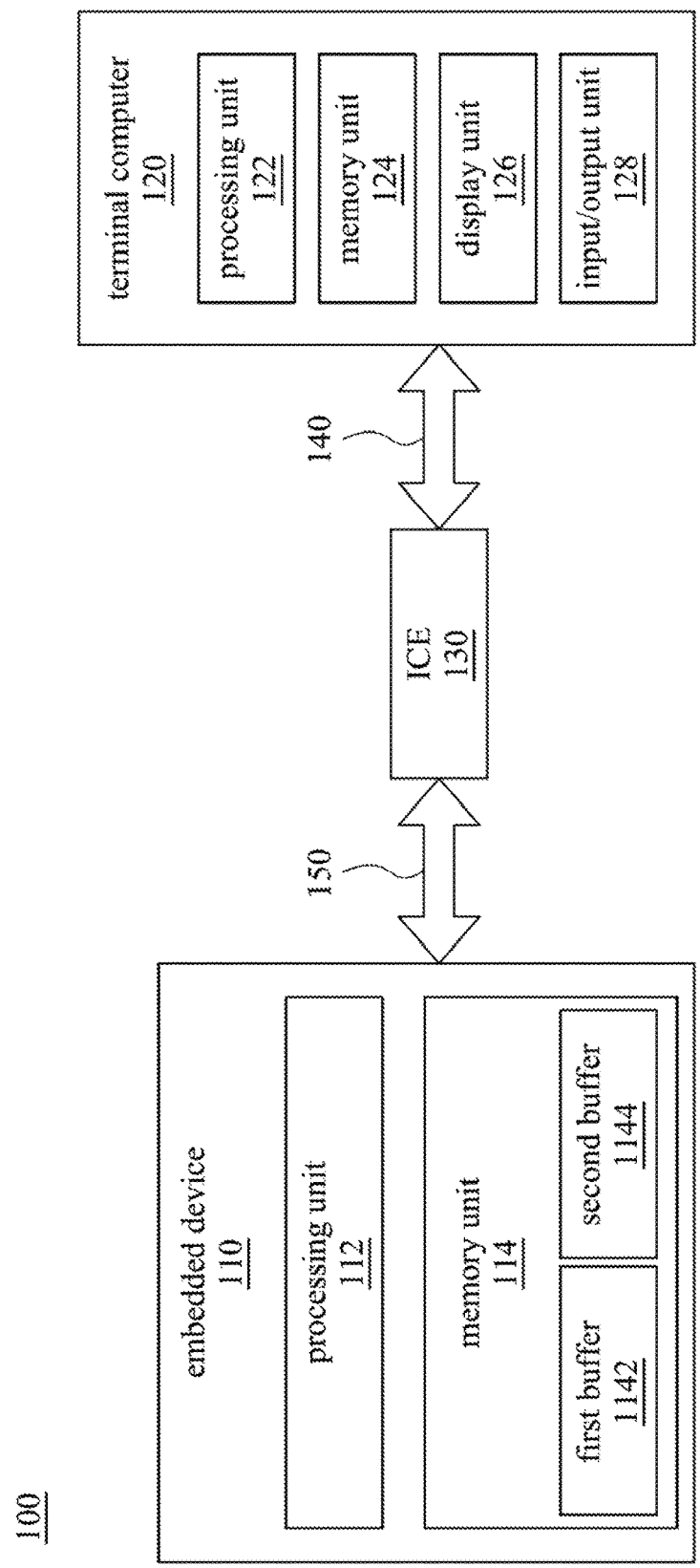
FIG. 1 is a block diagram illustrating a debugging system according to an exemplary embodiment of the present disclosure.

Reference will now be made in detail to the present embodiments of the disclosure, examples of which are illustrated in the accompanying drawings. Wherever possible, the same reference numbers are used in the drawings and the description to refer to the same or like parts.

The terms "first", "second", . . . etc., in the article do not refer to any specific order, nor intended to limit the present disclosure, it is only used for distinguishing the differences between components or operations with the same technological descriptions.

The term "couple" or "connected" is intended to mean two or more elements are either an indirect or direct electrical connection, while "coupled" may also refers to two or more elements can control or operate each other.

FIG. 1 is a block diagram illustrating a debugging system according to an exemplary embodiment of the present disclosure. The debugging system 100 is used for developing the software program executed by the embedded device 110. The embedded device 110 lacks components such as keyboard, screen and hard drive, moreover, and the hardware development is usually not yet completed during the developing processes, so the developers need to output and display the real-time debugging information, which is generated by the embedded device 110 during the operations of the program, to the terminal computer 120 having a display device.

In FIG. 1, the debugging system 100 includes an embedded device 110, a terminal computer 120 and an in-circuit emulator (ICE) 130. The embedded device 110 includes a processing unit 112 and a memory unit 114, and the memory unit 114 includes a first buffer 1142. The processing unit 112 is configured to execute at least one instruction, and to generate at least one real-time debugging information when executing the instruction, and to write the real-time debugging information into the first buffer 1142 in the memory unit 114. The terminal computer 120 is connected to the ICE 130 via a first interface 140, and the ICE 130 is connected to the embedded device 110 via a second interface 150. The terminal computer 120 uses polling to read the real-time debugging information stored in the first buffer 1142 via the ICE 130, and then deletes the real-time debugging information stored in the first buffer 1142 after reading the real-time debugging information. The real-time debugging information can be, for example, values of variables of a program or of an instruction, values stored at some particular addresses in the memory unit 114, or any other information which can be used for understanding the operating state of the program.

In some exemplary embodiments of the present disclosure, the processing unit 112 of the embedded device 110 is a CPU with an ARM architecture, and the memory unit 114 is a Static Random Access Memory (SRAM). In some other exemplary embodiments, the processing unit 112 of the embedded device 110 is a CPU with an MIPS architecture, and the memory unit 114 is a Dynamic Random Access Memory (DRAM). In other exemplary embodiments, the processing unit 112 of the embedded device 110 can be other type of processor. The memory unit 114 can be a flash memory, or other types of appropriate memory, the types of the memory unit 114 mentioned above are given for illustrative purposes, and the present disclosure is not limited thereto.

In an exemplary embodiment, the terminal computer 120 is a personal computer, the processing unit 122 is a CPU, the memory unit 124 includes a DRAM and a hard disk, the display unit 126 is a Liquid-Crystal Display (LCD) screen, and the input/output unit 128 includes a keyboard and a mouse. In another exemplary embodiment, the terminal computer 120 is a tablet, the processing unit 122 is an ARM processor or a MIPS processor, the memory unit 124 is a DRAM, a flash memory, a SD card and/or Solid State Drive (SSD), the display unit 126 is a touch Panel or an AMOLED screen, and the input/output unit 128 is an optical cursor or a keyboard. In other exemplary embodiments, the terminal computer 120 can be implemented by other hardware; that is, the aforementioned sets of the components of the terminal computer 120 are given for illustrative purposes, and are not limiting of the present disclosure.

In an exemplary embodiment, a polling period of the terminal computer 120 is 10 ms; in another exemplary embodiment, a polling period of the terminal computer 120 is 15 ms. People have ordinary skills in this art can change the polling period according to the design requirement; that is, the duration of polling period is not restricted to the above examples.

In an exemplary embodiment, the terminal computer 120 can delete the real-time debugging information stored in the first buffer 1142 after reading the real-time debugging information via the ICE 130, to enable the embedded device 110 to further write the new real-time debugging information into the first buffer 1142 continuously. In another exemplary embodiment, after reading the real-time debugging information via the ICE 130, the terminal computer 120 sets a flag in the memory unit 114, the processing unit 112 reads a value of the flag to check if the real-time debugging information in the first buffer 1142 has been read; if yes, the real-time debugging information in the first buffer 1142 can be overwritten.

By the aforementioned disclosure of the present disclosure, the embedded device 110 can write the real-time debugging information in the first buffer 1142, and the terminal computer 120 uses polling to periodically check the first buffer 1142, and, when the first buffer 1142 has the real-time debugging information, read the real-time debugging information and display the real-time debugging information on the display unit 126, thereby allowing the developers knowing the operating state of the program and debugging the program. In this way, the embedded device 110 in the debugging system 100 would not need an additional hardware interface for transmitting the real-time debugging information, and there is also no need for the embedded device 110 to interrupt the operations of the program to output the real-time debugging information, thereby significantly improving the debugging efficiency and shortening the product development cycle.

In an exemplary embodiment, the first interface 140 which is connected between the terminal computer 120 and the ICE 130 is a Universal Serial Bus (USB) interface, and the second interface 150 which is connected between the ICE 130 and the embedded device 110 is a Joint Test Action Group (JTAG) interface. In other exemplary embodiments, the first interface 140 is a USB Human Interface Device (USB HID) interface, and the second interface 150 is a Background Debug Mode (BDM) interface. In other exemplary embodiments, the first interface 140 and the second interface 150 can be other types of interfaces; that is, the aforementioned descriptions are given for illustrative purposes, and are not limiting of the present disclosure.

When a remaining space of the first buffer 1142 is insufficient for storing all generated real-time debugging information, the embedded device 110 would wait for the terminal computer 120 to read and then delete the real-time debugging information in the first buffer 1142 before writing the new real-time debugging information into the first buffer 1142. In an exemplary embodiment, the embedded device 110 implements busy waiting for keeping checking if the information stored in the first buffer 1142 has been deleted. If yes, the embedded device 110 would write the new real-time debugging information into the first buffer 1142 after the first buffer 1142 is cleaned, and end the busy waiting to continue the instruction.

Many factors affect determination of an initial address and size of the first buffer 1142 in the memory unit 114. The larger the space of the first buffer 1142, the less the waiting time of the embedded device 110. However, if the space of the first buffer 1142 is too large, the available memory space for the embedded device 110 to execute the program or the instruction will be restricted. Moreover, the higher the transmission rate of the first interface 140 and the second interface 150, or the shorter the polling period of the terminal computer 120, the better the speed of the first buffer 1142 being cleaned, thereby reducing the space required by the first buffer 1142. In an exemplary embodiment, a size of the first buffer 1142 is 256 byte; in other exemplary embodiments, the size of the first buffer 1142 is 512 byte. People have ordinary skills in this art can change the initial address and the size of the first buffer 1142 according to the design requirement, that is, the initial address and size of the first buffer 1142 are not limited to the above examples.

In an exemplary embodiment, the memory unit 114 is used for recording an initial address and the size of the first buffer 1142, and the processing unit 112 and the terminal computer 120 read the recorded initial address and the recorded size, and then read or write the real-time debugging information at the corresponding memory address in the memory unit 114. In other exemplary embodiments, the non-volatile memory in the memory unit 114 is configured to record the initial address and size of the first buffer 1142, and the developers can change the initial address and size of the first buffer 1142 recorded in the memory unit 114 according to the design requirements.

In another exemplary embodiment, the memory unit 114 further includes a second buffer 1144. The terminal computer 120 writes remote information to the second buffer 1144 via the ICE 130. The embedded device 110 uses polling to read the second buffer 1144 for accessing the remote information. In other words, the developers input the remote information according to the executing state of the program, and the embedded device 110 obtains the remote information via the ICE 130, to further execute the program or the instruction according to the remote information. Then the developers find the bugs according to the real-time debugging information generated by the embedded device 110. In this way, the embedded device 110 and the terminal computer 120 can achieve bi-directional communications via the ICE 130, thereby making the debugging process more efficient and reducing the development costs.

It is noted that when the terminal computer 120 is to write the remote information into the second buffer 1144, it needs to check if the remaining space of the second buffer 1144 is sufficient. If the remaining space of the second buffer 1144 is insufficient, the terminal computer 120 turns into a waiting state, to wait for the embedded device 110 to read and clean the second buffer 1144 before the terminal computer 120 writes the remote information.

Similarly, the memory space and the initial address of the second buffer 1144 are recorded in the memory unit 114, to be read by the processing unit 112 and the terminal computer 120, and the processing unit 112 and the terminal computer 120 will write or read the remote information at a corresponding memory address in the memory unit 114. In an exemplary embodiment, since the data amount of the remote information required for the embedded device 110 in the process of executing the instruction is usually less than the data amount of the real-time debugging information, the memory space of the second buffer 1144 is smaller than the memory space of the first buffer 1142; for example, the memory space of the second buffer 1144 can be 64 byte or 128 byte. One of ordinary skill in this art can change the initial address and size of the second buffer 1144 according to the design requirement.

Figure 2:
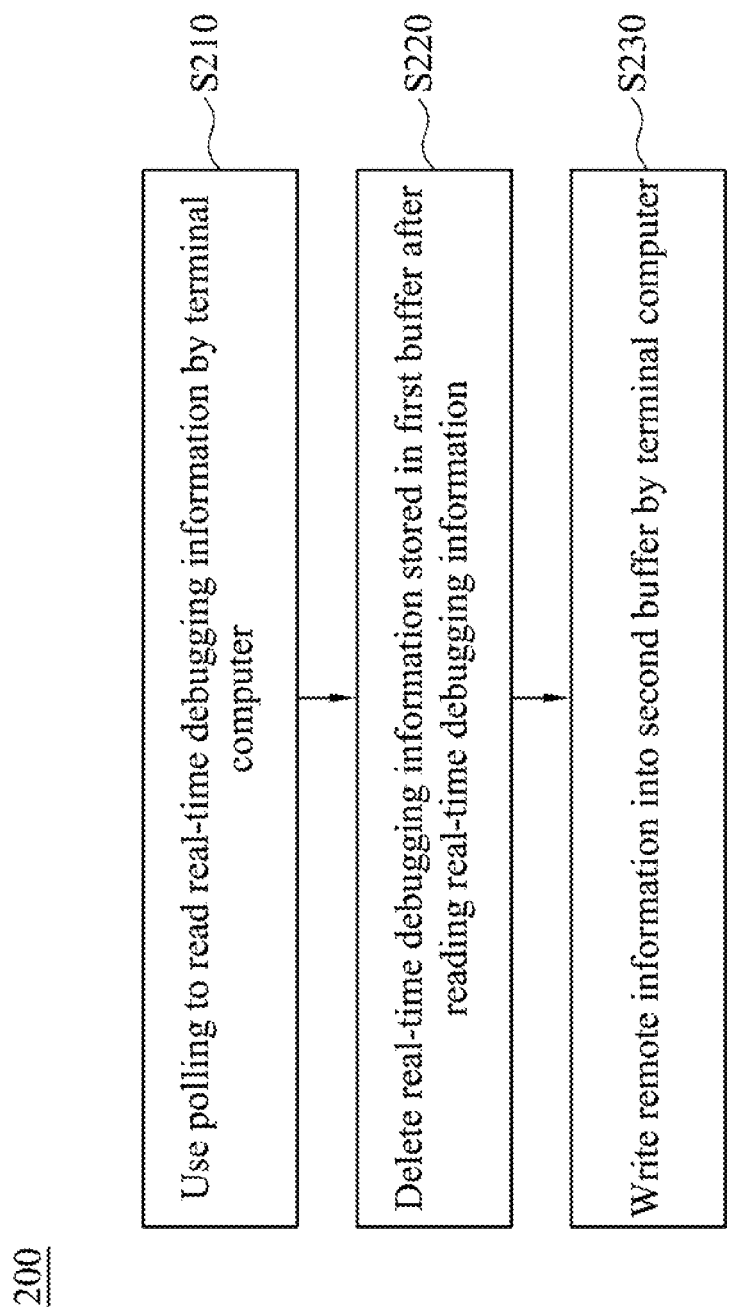
FIG. 2 is a flow chart illustrating a debugging method according to an exemplary embodiment of the present disclosure.

FIG. 2 is a flow chart of a debugging method according to an exemplary embodiment of the present disclosure. It should be appreciated that the order of the steps of the flowchart of the debugging method 200 in FIG. 2 is given for illustrative purposes, and it is not meant to be a limitation of the present disclosure. In addition, a new step can be added in the debugging method 200 or one of the steps of the debugging method 200 can be decreased to meet the actual needs. In this embodiment, in order to facilitate the understanding, the following descriptions will be made with reference to the debugging system 100 in FIG. 1 as an example, and thus it is not meant to be a limitation of the present disclosure.

In step S210 of the debugging method 200, polling is used to read at least one real-time debugging information from the embedded device 110 via the ICE 130, by the terminal computer 120. In some exemplary embodiments, before executing step S210, the embedded device 110 is preset to write the real-time debugging information generated during execution of the instruction, into the first buffer 1142 in the embedded device 110. In an exemplary embodiment, the terminal computer 120 reads the initial address and the size of the first buffer 1142 recorded in the memory unit 114, for reading the real-time debugging information from the first buffer at the corresponding address in the memory unit 114. The polling used by the terminal computer 120 and the details including the real-time debugging information are disclosed as discussed above, and thus they are not further detailed herein.

In step S220, the terminal computer 120 deletes the real-time debugging information stored in the first buffer 1142 after reading the real-time debugging information. In an exemplary embodiment, under a condition that the embedded device 110 is to write the new real-time debugging information but the first buffer 1142 still keeps the real-time debugging information which has not been read by the terminal computer 120, the embedded device 110 turns into a waiting state to wait for writing the new real-time debugging information until the terminal computer 120 reads and cleans the first buffer 1142. The operations that the embedded device 110 writes the first buffer 1142 and the terminal computer 120 reads and cleans the first buffer 1142 are discussed above, and thus they are not further detailed herein.

In an exemplary embodiment, after step S220, at least one entry of remote information is written, by the terminal computer 120, into the second buffer 1144 of the embedded device 110 via the ICE 130 (step S230), to allow the embedded device 110 to read the data in the second buffer 1144. For example, the embedded device 110 can use polling to read the second buffer 1144 for accessing the remote information. The operation that the terminal computer 120 writes and the remote information and the embedded device 110 reads the remote information are discussed above, and thus they are not further detailed herein.

As discussed above, the debugging system and the debugging method of the present disclosure can reduce the development costs of the embedded device, under the premise of adding no additional hardware interface, the present disclosure uses the pins originally within the embedded device to transmit the real-time debugging information or the remote information. In addition, when the embedded device outputs the real-time debugging information, it can also store the real-time debugging information in the memory unit. After the terminal computer reads the real-time debugging information, the terminal computer deletes the real-time debugging information, for the memory unit to accommodate the new real-time debugging information. As a result, the operations of the embedded device do not need to be interrupted during transmittal of the real-time debugging information. On the contrary, the terminal computer uses polling to check if the memory unit has the real-time debugging information;

in this way, the embedded device can continue the operation of the program during the debugging processes, thereby shortening the required debugging time and improving the development efficiency.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A debugging system, comprising:
    an embedded device comprising a memory unit, wherein the memory unit comprises a first buffer, the embedded device is configured for executing at least one instruction to generate at least one real-time debugging information, and writing the real-time debugging information into the first buffer; and
    a terminal computer connected to an in-circuit emulator (ICE) via a first interface, for using polling to read the real-time debugging information stored in the first buffer via the ICE, and deleting the real-time debugging information stored in the first buffer afterwards, wherein the ICE is connected to the embedded device via a second interface,
    wherein the memory unit further comprises a second buffer, the terminal computer is configured for writing at least one remote information into the second buffer via the ICE, wherein the embedded device is configured for using polling to read the second buffer for accessing the remote information.

2. The debugging system of claim 1, wherein the first interface is a Universal Serial Bus (USB) interface.

3. The debugging system of claim 1, wherein the second interface is a Joint Test Action Group (JTAG) interface.

4. The debugging system of claim 1, wherein the memory unit is configured for recording an initial address and a size of the first buffer.

5. The debugging system of claim 1, wherein when a remaining space of the first buffer is insufficient for writing the real-time debugging information, the embedded device writes the real-time debugging information into the first buffer after the first buffer is cleaned.

6. A debugging method, comprising:
    by a terminal computer, using polling to read at least one real-time debugging information from an embedded device via an in-circuit emulator (ICE), wherein the embedded device is configured for executing at least one instruction to generate the real-time debugging information, and writing the real-time debugging information into a first buffer in the embedded device;
    after reading the real-time debugging information, deleting the real-time debugging information stored in the first buffer; and
    by the terminal computer, writing at least one entry of remote information to a second buffer in the embedded device via the ICE, wherein the embedded device uses polling to read the second buffer for accessing the remote information.

7. The debugging method of claim 6, wherein the terminal computer is connected to the ICE via a first interface, and the first interface is a Universal Serial Bus (USB) interface.

8. The debugging method of claim 6, wherein the ICE is connected to the embedded device via a second interface, and the second interface is a Joint Test Action Group (JTAG) interface.

9. The debugging method of claim 6, further comprising:
    reading an initial address and a size of the first buffer recorded in the embedded device.

10. The debugging method of claim 6, wherein when a remaining space of the first buffer is insufficient for writing the real-time debugging information, the embedded device writes the real-time debugging information into the first buffer after the first buffer is cleaned.

* * * * *